United States Patent
Lin et al.

(10) Patent No.: US 8,860,150 B2
(45) Date of Patent: Oct. 14, 2014

(54) METAL GATE STRUCTURE

(75) Inventors: Chin-Fu Lin, Tainan (TW); Nien-Ting Ho, Tainan (TW); Chun-Hsien Lin, Tainan County (TW); Chih-Hao Yu, Tainan County (TW); Cheng-Hsien Chou, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 888 days.

(21) Appl. No.: 12/634,689

(22) Filed: Dec. 10, 2009

(65) Prior Publication Data

US 2011/0140207 A1  Jun. 16, 2011

(51) Int. Cl.
  *H01L 21/70* (2006.01)
  *H01L 29/78* (2006.01)
  *H01L 29/66* (2006.01)
  *H01L 21/28* (2006.01)
  *H01L 21/8238* (2006.01)
  *H01L 29/51* (2006.01)
  *H01L 29/49* (2006.01)

(52) U.S. Cl.
  CPC ...... *H01L 29/66545* (2013.01); *H01L 29/7833* (2013.01); *H01L 29/6659* (2013.01); *H01L 21/28088* (2013.01); *H01L 21/823842* (2013.01); *H01L 29/513* (2013.01); *H01L 29/517* (2013.01); *H01L 29/4966* (2013.01)
  USPC ............ 257/407; 257/408; 257/412; 257/413

(58) Field of Classification Search
  USPC .................................................. 257/407, 412
  See application file for complete search history.

(56) References Cited

U.S. PATENT DOCUMENTS

| | | | |
|---|---|---|---|
| 6,696,345 B2 * | 2/2004 | Chau et al. | 438/387 |
| 7,045,406 B2 * | 5/2006 | Huotari et al. | 438/198 |
| 2006/0231871 A1 * | 10/2006 | Amasuga et al. | 257/279 |
| 2008/0203488 A1 * | 8/2008 | Chung et al. | 257/369 |
| 2009/0057787 A1 | 3/2009 | Matsuki et al. | |
| 2009/0280631 A1 * | 11/2009 | Gambino et al. | 438/588 |

FOREIGN PATENT DOCUMENTS

| | | |
|---|---|---|
| TW | 1240994 | 10/2005 |
| TW | 200820435 | 5/2008 |

OTHER PUBLICATIONS

Jörgen Westlinder, Gustaf Sjöblom, Jörgen Olsson, Variable work function in MOS capacitors utilizing nitrogen-controlled TiNx gate electrodes, Microelectronic Engineering, vol. 75, Issue 4, Nov. 2004, pp. 389-396.*

Partial document of "Transaction Devices on Electron Device 2001", IEEE, 2001.

Qiu, "Research of molding the optical glass lens and surface modification", National Science Project, NSC94-2212-E-151-009, Oct. 31, 2006.

* cited by examiner

*Primary Examiner* — Mark Tornow
(74) *Attorney, Agent, or Firm* — Winston Hsu; Scott Margo (57) ABSTRACT

The metal gate structure of the present invention can include a TiN complex, and the N/Ti proportion of the TiN complex is decreased from bottom to top. In one embodiment, the TiN complex can include a single TiN layer, which has an N/Ti proportion gradually decreasing from bottom to top. In another embodiment, the TiN complex can include a plurality of TiN layers stacking together. In such a case, the lowest TiN layer has a higher N/Ti proportion than the adjusted TiN layer.

9 Claims, 5 Drawing Sheets

METAL GATE STRUCTURE

BACKGROUND OF THE INVENTION

1. Field of the Invention

The present invention relates to a metal gate structure and the related manufacture method, and especially to the metal gate of a MOS transistor structure.

2. Description of the Prior Art

In the field of semiconductor fabrication, the use of polysilicon material is diverse. Having a strong resistance for heat, polysilicon materials are commonly used to fabricate gate electrodes for metal-oxide semiconductor transistors. The gate pattern fabricated by polysilicon materials is also used to form self-aligned source/drain regions as polysilicon readily blocks ions from entering the channel region.

However, devices fabricated by polysilicon still have many drawbacks. In contrast to most metal, polysilicon gates are fabricated by semiconductor materials having higher resistance, which causes the polysilicon gate to work under a much lower rate than the metal gates. On the other hand, the conventional polysilicon gate also has faced problems such as unavoidable depletion effect which increases equivalent thickness of the gate dielectric layer, reduces gate capacitance, and worsens a driving force of the devices. Thus, work function metals are developed to replace the conventional polysilicon gate to be the control electrode.

With a trend towards scaling down the MOS size, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, obtains equivalent capacitor in an identical equivalent oxide thickness (EOT), and can be competent to the work function metals.

Materials of the work function metal gates should well operate in both an NMOS device and a PMOS device. Accordingly, compatibility and process control for the metal gate are more complicated, meanwhile thickness and composition controls for materials used in the metal gate method have to be more precise. It is still a challenge to form an optimized work function metal gate to improve the performance of MOS transistors.

SUMMARY OF THE INVENTION

It is therefore a primary objective of the present invention to provide a metal gate structure and method of forming the metal gate structure, which has a ratio of nitrogen to titanium (N/Ti) reduced from bottom to top, so as to reduce the EOT, and to maintain the effective work function (EWF).

From one aspect of the present invention, a metal gate structure is disclosed. The metal gate structure includes a gate dielectric layer, a first work function metal layer disposed on the gate dielectric layer, and a second work function metal layer disposed on the first work function metal layer. Both the first and the second work function metal layers are substantially composed by a first element and a second element, and at least one physical property of the first work function metal layer is different from the physical property of the second work function metal layer.

From one aspect of the present invention, a metal gate structure is disclosed. The metal gate structure includes a gate dielectric layer, and a work function metal layer disposed on the gate dielectric layer. The work function metal layer is substantially composed by a first element and a second element, and at least one physical property of the work function metal layer changes along with a thickness of the work function metal layer.

From one aspect of the present invention, a method of forming a metal gate structure is disclosed. First, a gate dielectric layer is formed. Subsequently, a process is performed to form a work function metal compound layer on the gate dielectric layer. At least one process recipe are changed during the process of forming the work function metal compound layer.

Accordingly, the present invention can reduce the EOT of the HK/MG (the high-k dielectric and metal gate) type MOS transistor, and maintains the flat band voltage, and provides a proper EWF value.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto. Furthermore, the step serial numbers concerning the saturation adjustment method are not meant thereto limit the operating sequence, and any rearrangement of the operating sequence for achieving same functionality is still within the spirit and scope of the invention.

The metal gate structure of the present invention can be a poly-Si/metal stacking gate, or may be consisting essentially of metals, such as a stacking gate including different work function metals. The formation method of the metal gate structure can include depositing a first work function metal layer and a poly-silicon layer, and then patterning the first work function metal layer and the poly-silicon layer by the photo-lithography and etching process to form a gate. In other case, a dummy gate conductor consisting of poly-silicon may be first formed, a transistor is then formed with the dummy gate, thereafter the dummy gate is removed by etching, and then the needed metal is formed to replace the dummy gate and to fabricate a metal gate.

Figure 1:
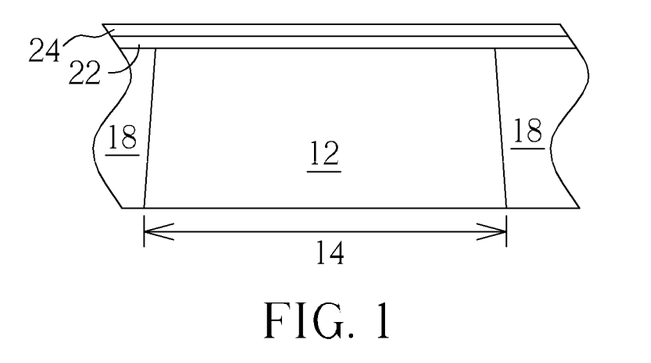
FIGS. 1-6 illustrate a method for fabricating a transistor having a metal gate according to a first preferred embodiment of the present invention.

Referring to FIG. 1 through FIG. 6, FIGS. 1-6 illustrate a method for fabricating a transistor having a metal gate 66 according to a first preferred embodiment of the present invention. In, the first preferred embodiment, the metal gate 66 is formed by adopting a dummy gate. The like numbered numerals designate similar or the same parts, regions or elements. It is to be understood that the drawings are not drawn to scale and are served only for illustration purposes. As shown in FIG. 1, a substrate 12, such as a silicon substrate, a silicon-containing substrate, or a silicon-on-insulator (SOI) substrate, is provided. At least one transistor region 14 is defined in the substrate 12 and at least one shallow trench isolation (STI) structure 18 is formed in the substrate 12.

The transistor region 14 is a region for forming a PMOS transistor, an NMOS transistor or a CMOS transistor, and the STI structure 18 is formed for separating the transistor region 14. Subsequently, a gate dielectric layer 22 is formed on the surface of the substrate 12, and an optional cap layer 24 is formed on the gate dielectric layer 22. In this embodiment, gate dielectric layer 22 may include HfSiO, HfSiON, HfO, LaO, LaAlO, ZrO, ZrSiO, HfZrO, or combination thereof; the cap layer 24 may include LaO, Dy2O3, or combination thereof. In other embodiments, the gate dielectric layer 22 may include dielectric layers, such as silicon dioxide layer and nitrogen silica layer.

Figure 2A:
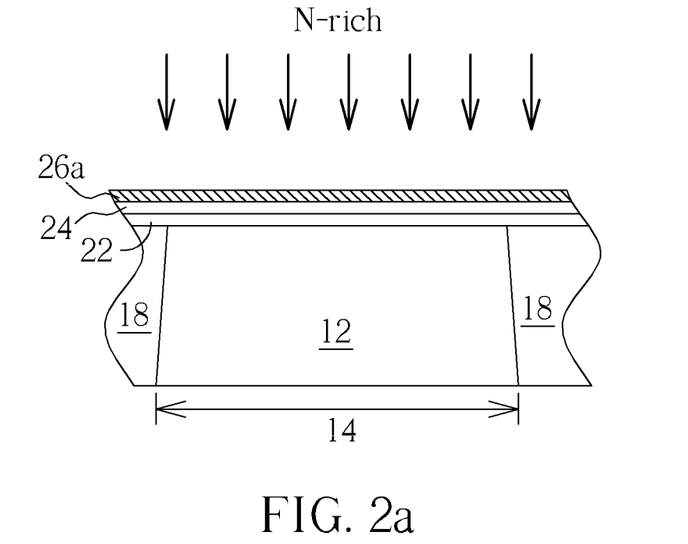
Figure 2B:
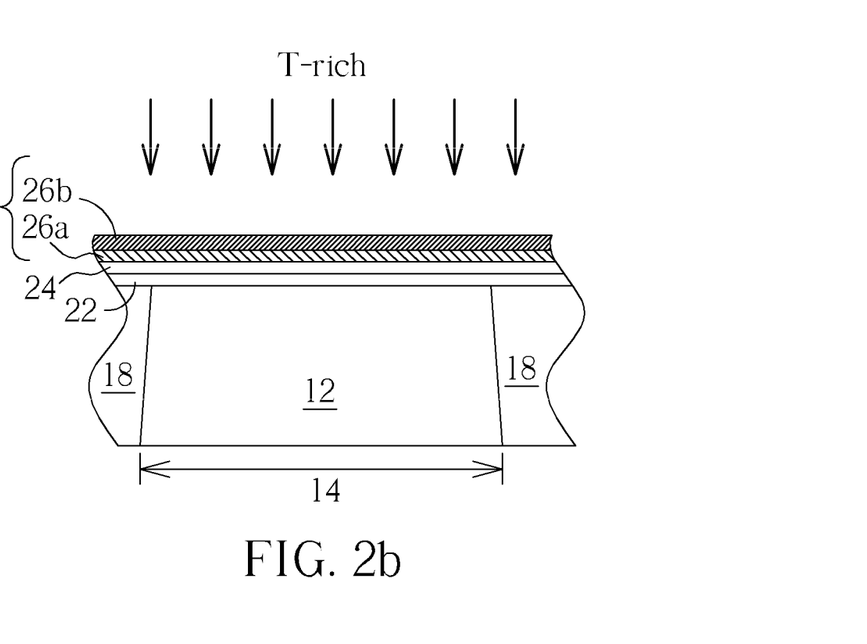

Please refer to FIG. 2a and FIG. 2b. Afterward, a process, such as a physical vapor deposition (PVD) process, a chemical vapor deposition (CVD) process or an atomic layer deposition (ALD) process, is carried out on the substrate 12 to form a work function metal compound layer 26 on the gate dielectric layer 22. At least one process recipe are adjusted during the process so that the work function metal compound layer 26 may have a multiple-layer structure in the present invention. In other words, the process of forming the work function metal compound layer 26 may include a plurality of process steps, the process recipe in each of the process steps is fixed individually, and the process recipe of the adjacent process steps may be different from each other in this embodiment. In the concrete, the present invention can stop supplying the process gas or turns off the power for a while so as to briefly interrupt the deposition, next changes at least one of the process recipes, such as the process gas flow rate and/or the process power, and thereafter performs the next process step with the changed process recipe. Thus, the work function metal compound layer 26 in this embodiment actually includes a plurality of material layers. At least one physical property of the adjacent material layers can be different from each other. The physical property in each of the material layers is fixed and uniform individually, and does not change with the thickness.

In more detail, a first work function metal layer 26a is first formed on the gate dielectric layer 22 as shown in FIG. 2a, and afterward a second work function metal layer 26b is formed on the first work function metal layer 26a. As a result, the work function metal compound layer 26 of this embodiment can include both the first work function metal layer 26a and the second work function metal layer 26b. Both the first and the second work function metal layers 26a and 26b are substantially composed by a first element and a second element in the present invention. The first the element is preferably titanium (Ti) or tantalum (Ta), and the second element is preferably nitrogen (N). In other words, the work function metal compound layer 26 of the present invention can preferably include titanium nitride (TiN) or tantalum nitride (TaN), and take TiN as optimum.

The main difference between the first and second work function metal layer 26a, 26b lies in the physical properties. Because the process recipe for forming the first work function metal layer 26a and the process recipe for forming the second work function metal layer 26b are different, at least one physical property of the first work function metal layer 26a, such as a molecular composition (affecting the composition ratio and the chemical formula), density, resistivity or a preferred crystal orientation, can be different from the physical property of the second work function metal layer 26b. For example, the process recipe for forming the first work function metal layer 26a can be as follows: DC power is preferably between 800 watts and 1200 watts, RF power is preferably between 640 watts and 960 watts, the argon flow rate is preferably between 16 standard cubic centimeters per minute (sccm) and 24 sccm, the nitrogen flow rate is preferably between 32 sccm and 48 sccm, and the flow ratio of nitrogen to argon is substantially between 1.6 and 2.4. Therefore, the first work function metal layer 26a can have a higher N/Ti ratio (also be called N-rich), and, more specifically, Ti/N ratio of the first work function metal layer 26a can be substantially larger than 0.8. Also, the process recipe for forming the second work function metal layer 26b can be as follows: DC power is preferably between 800 watts and 1200 watts, RF power is preferably between 640 watts and 960 watts, the argon flow rate is preferably between 16 sccm and 24 sccm, the nitrogen flow rate is preferably between 16 sccm and 24 sccm, and the flow ratio of nitrogen to argon is substantially between 0.8 and 1.2. Hence, the second work function metal layer 26b can have a higher Ti/N ratio (also be called Ti-rich) in this embodiment, and, more specifically, Ti/N ratio of the second work function metal layer 26b can be substantially less than 0.9.

The item Ti-rich means that the work function metal layer is in a metallic mode. In other words, the main element on the surface of the work function metal layer is still titanium element. The item N-rich means that the work function metal layer is in a poison mode. In other words, the most surface of the work function metal layer is nitrified to include TiN. The contained nitrogen ratio of the work function metal layer positively relates to the nitrogen gas flow rate. Thus, a great nitrogen gas flow leads to a work function metal in the poison mode, and a fewer nitrogen gas flow leads to a work function metal in the metallic mode.

Referring to the material selection, if both NMOS transistor and PMOS transistor should be formed, for example a CMOS transistor should be formed; the fermi level of the metal gate preferred approaches the mid-gap of silicon. Accordingly, it is easier to regulate the critical voltages ($V_{th}$) of the NMOS transistor and the PMOS transistor, so it is proper to form both NMOS transistor and PMOS transistor in consideration with the critical voltages of the NMOS transistor and PMOS transistor. In addition, the material of the metal gate in the present invention preferably has a great stability in high temperature, preferably has a great adhesive property, and can blocking undesired ions or elements. As a result, the gate material does not easily penetrate into the substrate or the dielectric layer to cause pollution; it is not easily for the impurities to penetrate the gate, and material layers of the gate do not easily peel off. The first and the second work function metal layers 26a, 26b may include the material conforming to the above description. For example, the work function metal compound layer 26 can also include other metallic material layers, such as nitration tungsten (WN) in other embodiments.

Generally speaking, a proper work function value for the PMOS is about 5.2, and a proper work function value for the NMOS is about 4.11. According to the research of the present invention, the MOS transistor having the metal gate preferably adopts above-mentioned TiN as the material of the fermi level. The metal gate formed by the present invention is applicably for the PMOS transistor, the NMOS transistor and the CMOS transistor. Particularly, the N-rich TiN used in the present invention can provide a proper work function value for the PMOS transistor. However it should be noticed that, the N-rich TiN may cause the EOT to increase in the meantime. This is because the nonconductors, such as the nitrogen element (nitrogen atom) or the oxide element (oxide atom) may penetrate into the work function metal of the MOS transistor to cause a larger EOT, and in other words a deviation of EOT. For solving this problem, a Ti-rich TiN is further formed on the N-rich TiN in the present invention. It is found that, when the actual thicknesses of the material layer or material layers are the same, the TiN compound layer including both the N-rich TiN layer and the Ti-rich TiN layer of the present invention can provide a smaller EOT than a single Ti-rich TiN layer or a single N-rich TiN layer does.

Referring to the process recipes, it is found in the research of the present invention that, the physical properties of the work function metal layer, such as element composition (elements ratio), density, resistivity, preferred crystal orientation and defect density, are influenced by the nitrogen gas flow rate or the nitrogen gas flow ratio. It is noticed that, when the gas flow rate of the nitrogen gas approaches, for instance, 20 sccm, some physical properties have non-linear transitions. The condition causing the conversion is called a turning point. One of the possible reasons causing the turning point lies in the conversion of the preferred crystal orientation. The preferred crystal orientation changed between (1, 1, 1) and (2, 0, 0), when the of nitrogen gas flow rate approaches 20 sccm. When the nitrogen gas flow rate is smaller then 20 sccm, the increase of the nitrogen gas flow rate leads to the decrease of the resistivity and EOT of the work function metal layer, and more the nitrogen gas flow rate approaches 20 sccm, more the flat band voltage of the work function metal layer increase; When the nitrogen gas flow rate is larger then 20 sccm, the increase of the nitrogen gas flow rate leads to the increase of the resistivity and EOT of the work function metal layer, and more the nitrogen gas flow rate increase, less the flat band voltage of the work function metal layer increase. Thus, a nitrogen gas flow rate approaching 20 sccm (approaching the turning point) is preferred in the present invention for minimizing the EOT.

In addition, since the CVD process usually forms a TiN layer with more impurities, the PVD process is preferred for forming the work function metal layer of the present invention. Moreover, since the plasma of a high-power PVD process may affect the High-K material, a PVD process with a low power is more preferred for providing the work function metal layer with a superior quality.

Figure 3:
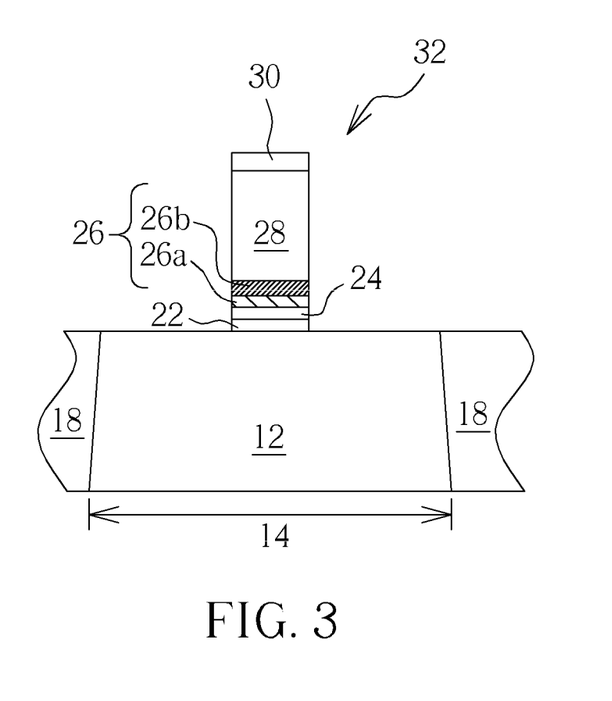

As shown in FIG. 3, a polysilicon layer 28, and a hard mask 30 are formed on the work function metal compound layer 26. The polysilicon layer 28 is used as a sacrificial layer, which may include undoped polysilicon, doped polysilicon, amorphous silicon, other materials or combination thereof. The hard mask 30 can include $SiO_2$, SiN, SiC, SiON, or combination thereof. Next, a patterned photoresist (not shown) is formed on the hard mask 30, and a pattern transfer process is conducted by using the patterned photoresist as a mask to remove a portion of the hard mask 30, the polysilicon layer 28, the work function metal compound layer 26, the cap layer 24, and the high-k dielectric layer 22 through single or multiple etching processes. After stripping the patterned photoresist, a dummy gate 32 is formed in the transistor region 14.

Figure 4:
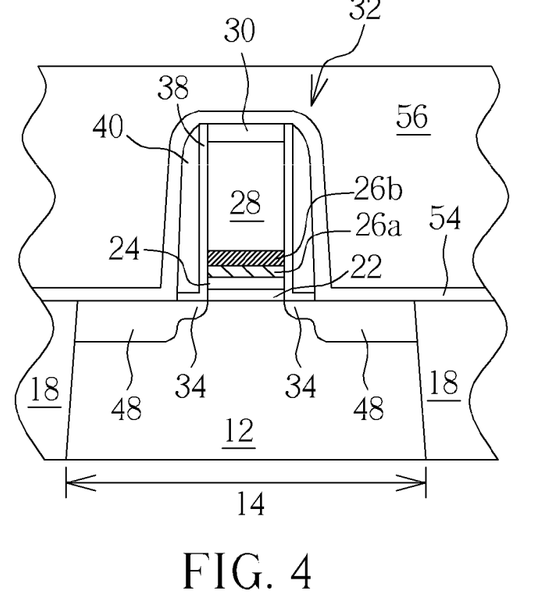

As shown in FIG. 4, a light doping process is selectively performed to form a lightly doped source and a lightly doped drain in the transistor region 14. For instance, a patterned photoresist (not shown) can be first disposed on regions outside the transistor region 14, and an ion implantation is conducted by using the patterned photoresist as mask to implant n-type dopants into the substrate 12 adjacent to two sides of the dummy gate 32 for forming lightly doped sources/drains 34 of a NMOS transistor. Alternately, the ion implantation can be conducted to implant p-type dopants into the substrate 12 adjacent to two sides of the dummy gate 32 region 16 for forming lightly doped sources/drains 34 of a PMOS transistor. In addition, an offset spacer can be formed the sidewall of the on dummy gate 32 before forming the lightly doped sources/drains 34.

Next, a first stage of the spacer formation is conducted by oxidizing the surface of the polysilicon layer 28 or through deposition process to form a silicon oxide layer 38, thereafter depositing a silicon nitride layer 40 and following that etching the silicon oxide layer 38 and the silicon nitride layer 40 to form a spacer on the sidewall of the dummy gate 32. A selective epitaxial growth (SEG) process may be conducted to form strained silicon in the substrate 12. Depending on the demand of the fabrication, a epitaxial layer may provides a compressive strain to the channel region of a PMOS transistor thereby increasing the hole mobility of the PMOS transistor. Alternatively, an epitaxial layer composed of SiC may be grown in the substrate 12 at two sides of the dummy gate 32 to provide a tensile strain to the channel region of the NMOS transistor and increases the electron mobility of the NMOS transistor.

Afterward, a heavy doping process may be conducted to form a plurality of source/drain regions. The process for forming the source/drain regions is similar to the aforementioned light doping process but using higher doping concentration, so the description is omitted here. It should be noted that the aforementioned source/drain regions could be fabricated by using selective epitaxial process, the order of the fabrication process could be rearranged or adjusted according to the demand of the product, and the number of the spacers could also adjusted accordingly.

Next, a silicon nitride layer 54 may be selectively deposited over the surface of the dummy gate 32, silicon nitride layer 40, and substrate 12. In this embodiment, the silicon nitride layer 54 can serve as an etch stop layer in a planarize process conducted afterwards. Additionally, the silicon nitride layer 54 may be formed with a large thickness to serve as a stress cap layer. Following that, an interlayer dielectric layer 56 is deposited on the silicon nitride layer 54. The interlayer dielectric layer 56 may include oxide, nitride, carbide, low dielectric constant material or combination thereof.

Figure 5:
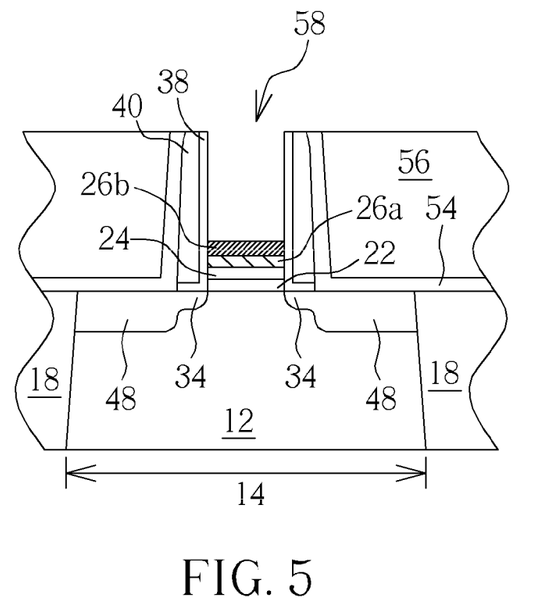

As shown in FIG. 5, a chemical mechanical polishing (CMP) process or a dry etching process is performed to remove a portion of the interlayer dielectric layer 56, the silicon nitride layer 54, and the hard mask 30 until reaching and exposing the surface of the polysilicon layer 28, such that the top of the dummy gate 32 is substantially even with the surface of the interlayer dielectric layer 56. Next, a selective dry etching or wet etching is conducted by using ammonium hydroxide (NH4OH) or tetramethylammonium hydroxide (TMAH) to remove the polysilicon layer 28 disposed in the transistor region 14 without damaging the interlayer dielectric layer 56. In this embodiment, the etching process preferably forms an opening 58 in the transistor region 14 to expose the work function metal compound layer 26.

The above-mentioned CMP process or dry etching process can be set with a predetermined performing time period, so as to expose the poly-silicon layer 28 directly. In another embodiment, the CMP process may be divided into several CMP steps according to the grinding conditions for different material layers. For example, the mask layer 30 may be set as a CMP stop point for the first CMP step. Therefore, the ILD layer 56 and silicon-nitride layer 54 are polished until exposing the surface of the mask layer 30 in the first CMP step. When the first CMP step is performed on the mask layer 30, the material change is detected, and the first CMP step is completed. Thereafter, a second CMP step is performed to polish the mask layer 30 until exposing the poly-silicon layer 28. The second CMP step can be set with a predetermined performing time period, or can detect the material change as a CMP stop point.

In other embodiments, the CMP process or dry etching process may be performed to remove a portion of the interlayer dielectric layer 56 and the silicon nitride layer 54 until exposing the hard mask 30, and thereafter a wet etching process may be performed to remove the mask layer 30.

Figure 6:
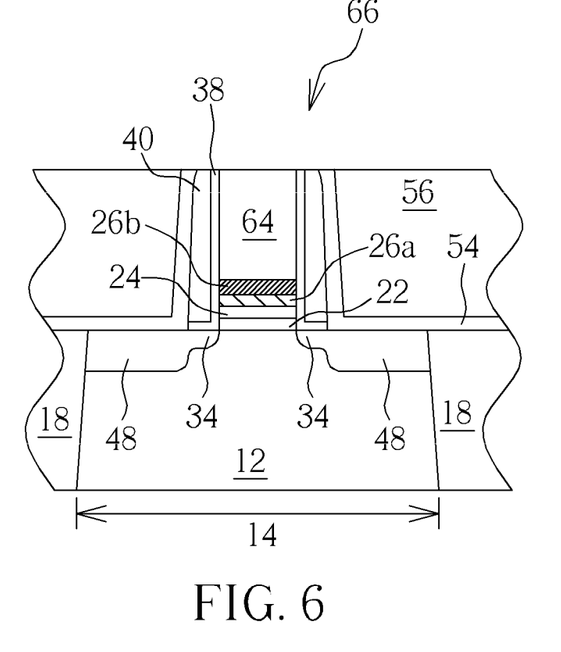

As shown in FIG. 6, a conductive layer 64 may next be formed on the work function metal compound layer 26 in the transistor region 14 to fill the opening 58. The conductive layer 64 is composed of low resistance material, and may include Al, W, TiAl or cobalt tungsten phosphide (CoWP). Furthermore, another chemical mechanical polishing process may be performed to remove a portion of the conductive layer 64 for forming a transistor having a metal gate 66.

It should be noted that the metal gate structure of the present invention can be applied in the gate-first process. In other words, it does not require defining the dummy gate, and the stacking gate including different work function metals can directly serve as a gate electrode. More specifically, another embodiment can first provide the substrate 12, the STI structure 18, the gate dielectric layer 22 and the selective cap layer 24 according to the steps shown in FIG. 1. Then, the first work function metal layer 26a can be first formed on the gate dielectric layer 22 as shown in FIG. 2a, and afterward the second work function metal layer 26b can be formed on the first work function metal layer 26a. Hence, without defining the dummy gate, the fabrication of the metal gate structure can be achieved.

In addition, the performing order of the above-mentioned processes (FIGS. 1-6) all can change or regulate according to the process requirement. For example, the first and second work function metal layers 26a, 26b can be formed on the cap layer 24 after removing the poly-silicon layer 28. In other words, the process for forming the dummy gate in another embodiment does not include depositing the work function metals, and the deposition of the work function metals can be performed after removing the polysilicon layer of the dummy gate. Therefore, in this embodiment, the work function metals also can exist on the sidewall of the gate electrode.

According to the present invention, the metal gate structure 66 can be the gate of a PMOS transistor, the gate of a NMOS transistor or the gate of a CMOS transistor. In addition, an ion implant process or a surface treatment may be performed on to the work function metal compound layer, the process conditions or recipes may be changed, or the number of the material layer included in the work function metal compound layer may be increased or decreased to benefit various transistors, so the gate of the present invention can match with the needed work function value or other characteristics of the various transistors. For example, nitrogen ions may be implanted on the first or the second work function metal layer 26a, 26b to increase the work function value in the present invention for a PMOS transistor.

Furthermore, other work function metal layers, such as a N-rich work function metal layer, may further be formed on the above-mentioned work function metal compound layer 26 in the present invention.

Figure 7:
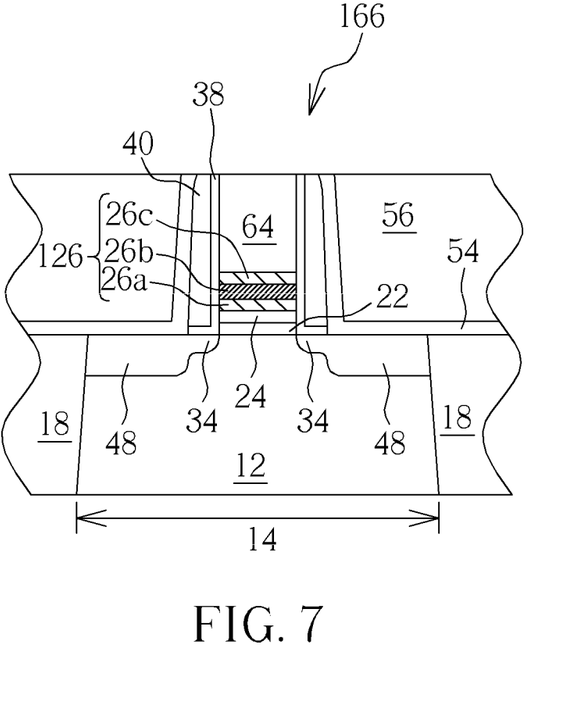
FIG. 7 illustrates a method for fabricating a transistor having a metal gate according to a second preferred embodiment of the present invention.

Please Refer to FIG. 7. FIG. 7 illustrates a method for fabricating a transistor having a metal gate 166 according to a second preferred embodiment of the present invention. As shown in FIG. 7, this embodiment can first provide the substrate 12, the STI structure 18, the gate dielectric layer 22 and the selective cap layer 24 according to the steps shown in FIG. 1. One of the main differences between the first preferred embodiment and the second preferred embodiment is that, the process of forming the work function metal compound layer 126 actually include at least three process steps for forming the first work function metal layer 26a, the second work function metal layer 26b and a third work function metal layer 26c respectively. In other words, after the first and second work function metal layers 26a, 26b are formed according to the steps shown in FIG. 2a and FIG. 2b, the process recipe is changed again to form the third work function metal layer 26c. At least one physical property of the third work function metal layer 26c is different from the adjacent second work function metal layer 26b. For Instance, the third work function metal layer 26c is preferably an N-rich TiN layer. More specifically, the physical properties and the process recipes of the third work function metal layer 26c may be the same with those of the first work function metal layer 26a. Afterward, a MOS transistor having a metal gate structure 166 formed according to the steps shown in FIG. 3 through FIG. 6.

Accordingly, it is preferred to perform the PVD process for forming the work function the metal compound layer 126 in the second embodiment. In such a case, the preferred nitrogen gas flow rate is substantially between 32 sccm and 48 sccm in the first process step; the preferred process power is substantially between 400 watts and 600 watts in the first process step; and the preferred actual thickness of the first work function metal layer 26a is substantially between 48 angstroms and 72 angstroms. The preferred nitrogen gas flow rate is substantially between 16 sccm and 24 sccm in the second process step; the preferred process power is substantially between 800 W and 1200 W in the second process step; and the preferred actual thickness of the second work function metal layer 26b is substantially between 64 angstroms and 96 angstroms. The preferred nitrogen gas flow rate is substantially between 32 sccm and 48 sccm in the third process step; the preferred process power is substantially between 400 watts and 600 watts in the third process step; and the preferred actual thickness of the third work function metal layer 26c is substantially between 48 angstroms and 72 angstroms. Thus, the gate of this embodiment can provide a EOT about 14.19 nanometers, a flat band voltage about −0.565 volts, and a work function value about 4.58.

Figure 8:
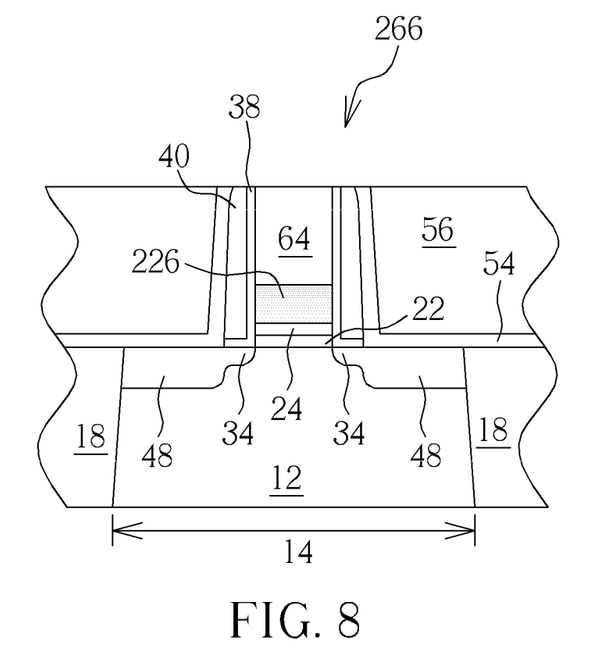
FIG. 8 illustrates a method for fabricating a transistor having a metal gate according to a third preferred embodiment of the present invention.

In other embodiments, the process of forming the work function metal compound layer does not need to be divided into a plurality of process step actually. The process recipe can be gradually changed in a single process, so the N/Ti value of a TiN compound structure or of a single TiN layer changes along with the thickness of the TiN compound structure or the single TiN layer. Please Refer to FIG. 8 and FIG. 9. FIG. 8 illustrates a method for fabricating a transistor having a metal gate 266 according to a third preferred embodiment of the present invention, and FIG. 9 illustrates a method for fabricating a transistor having a metal gate 366 according to a fourth preferred embodiment of the present invention.

As shown in FIG. 8, one of the main differences between the first preferred embodiment and the third preferred embodiment lies in the process of forming the work function metal compound layer. The process recipe of forming the work function metal compound layer 226 is actually gradually changed during a single process in the third preferred embodiment. Thus, the work function metal compound layer 226 can include only one TiN layer, and at least one physical property of the work function metal compound layer 226, such as the N/Ti value, decreases along with the thickness of the work function metal compound layer 226 from bottom to top. In the concrete, the formulation of the work function metal compound layer 226 may include gradually changing the process gas flow rate (nitrogen gas flow rate) or the process power. For example, the nitrogen gas flow rate may gradually reduce from 40 sccm to 20 sccm.

Figure 9:
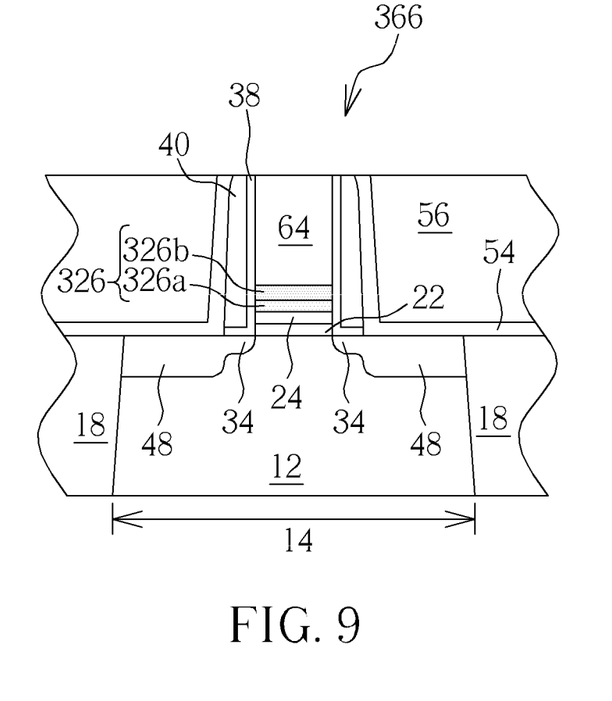
FIG. 9 illustrates a method for fabricating a transistor having a metal gate according to a fourth preferred embodiment of the present invention.

As shown in FIG. 9, one of the main differences between the third preferred embodiment and the fourth preferred embodiment is that the fourth preferred embodiment includes a pumping down step. As a result, at least one physical property of the first work function metal layer 326a, such as the N/Ti value, decreases along with its thickness from bottom to top; and at least one physical property of the second work function metal layer 326b, such as the N/Ti value, also decreases along with its thickness from bottom to top. However, the physical property change of the work function metal compound layer 326 is not continuous along with the thickness. The physical property before the pumping down step and the physical property after the pumping down step are not continuous. In other words, the physical property of the first work function metal layer 26a and the physical property of the second work function metal layer 26b are not continuous at the interface between the first and second work function metal layers 26a, 26b.

In other embodiments, the present invention may not use the dummy gate method. In other words, the poly-silicon layer 28 is not removed and the conductive layer 64 is not formed. The poly-silicon layer 28 can be directly used as a portion of a gate structure, or the conductive layer 64 is first formed on the work function metal compound layer 26, 126, 226 or 326 as a portion of a gate structure to replace the poly-silicon layer 28.

In sum, the metal gate structure of the present invention can include a work function metal compound layer, such as a TiN complex, and at least one physical property of the work function metal compound layer changes along with its thickness. For instance, the work function metal compound layer may include a TiN complex, and the N/Ti proportion of the TiN complex is decreased from bottom to top. In one embodiment, the TiN complex can include a single TiN layer, which has an N/Ti proportion gradually decreasing from bottom to top. In other embodiments, the TiN complex can include a plurality of TiN layers stacking together. In such a case, the physical property in each of the material layers may be fixed and uniform individually, and the lowest TiN layer has a higher N/Ti proportion than the adjusted TiN layer. In another embodiment, the TiN complex may still include a plurality of TiN layers stacking together; each TiN layer has an N/Ti proportion gradually decreasing from bottom to top; and the lowest TiN layer has a higher N/Ti proportion than the adjusted TiN layer.

According to the above-mentioned methods, the present invention can have the following advantages. First, the metal gate structure has low resistance and can avoid the depletion effect, so can provide a faster driving rate and a better driving ability as compared with traditional the poly-silicon gate. Substantially, the N-rich TiN included in the bottom of the TiN compound structure can provide a proper work function value for the PMOS transistor in the present invention. In addition, the TiN compound structure also includes the Ti-rich TiN layer to prevent the penetration of nitrogen atom or oxide atom into the work function metal of the MOS transistor. Therefore, a deviation of EOT is avoided. The present invention can provide a smaller EOT value, and increase the whole capability of a MOS transistor.

Those skilled in the art will readily observe that numerous modifications and alterations of the device and method may be made while retaining the teachings of the invention.

What is claimed is:

1. A metal gate structure, comprising:
   a gate dielectric layer; and
   a gate electrode, comprising
      a first work function metal layer, disposed on the gate dielectric layer; and
      a second work function metal layer, disposed on the first work function metal layer;
   wherein both the first and the second work function metal layers are substantially composed by a first element and a second element, a ratio of the first element to the second element of the first work function metal layer is different from a ratio of the first element to the second element of the second work function metal layer, a ratio of the second element to the first element decreases along with a thickness of the first work function metal layer or a thickness of the second work function metal layer from bottom to top, and a molecular composition of the first work function metal layer and a molecular composition of the second work function metal layer are not continuous at an interface between the first work function metal layer and the second work function metal layer.

2. The metal gate structure of claim 1, wherein the first element is titanium, and the second element is nitrogen.

3. The metal gate structure of claim 1, wherein the first element is tantalum, and the second element is nitrogen.

4. The metal gate structure of claim 1, wherein a molecular composition of the first work function metal layer is different from a molecular composition of the second work function metal layer.

5. The metal gate structure of claim 1, wherein a density of the first work function metal layer is different from a density of the second work function metal layer.

6. The metal gate structure of claim 1, wherein a resistivity of the first work function metal layer is different from a resistivity of the second work function metal layer.

7. The metal gate structure of claim 1, wherein a preferred crystal orientation of the first work function metal layer is different from a preferred crystal orientation of the second work function metal layer.

8. The metal gate structure of claim 1, further comprising a cap layer disposed between the first work function metal layer and the gate dielectric layer.

9. The metal gate structure of claim 1, wherein the first work function metal layer and the second work function metal layer exist on a sidewall of the gate electrode.

* * * * *